United States Patent
Simmons et al.

[11] Patent Number: 5,825,049
[45] Date of Patent: Oct. 20, 1998

[54] RESONANT TUNNELING DEVICE WITH TWO-DIMENSIONAL QUANTUM WELL EMITTER AND BASE LAYERS

[75] Inventors: Jerry A. Simmons, Sandia Park, N. Mex.; Marc E. Sherwin, Rockville, Md.; Timothy J. Drummond, Tijeras, N. Mex.; Mark V. Weckwerth, Pleasanton, Calif.

[73] Assignee: Sandia Corporation, Albuquerque, N. Mex.

[21] Appl. No.: 728,003

[22] Filed: Oct. 9, 1996

[51] Int. Cl.⁶ .................. H01L 29/06; H01L 31/0328; H01L 31/072; H01L 31/109
[52] U.S. Cl. .................. 257/25; 257/15; 257/20; 257/24; 257/28; 257/105; 257/192; 257/472
[58] Field of Search .................. 257/15, 20, 24, 257/28, 105, 192, 472, 75

[56] References Cited

U.S. PATENT DOCUMENTS

| | | | |
|---|---|---|---|
| 4,581,621 | 4/1986 | Reed | 257/20 |
| 4,799,091 | 1/1989 | Reed | 257/25 |
| 4,912,531 | 3/1990 | Reed et al. | 257/17 |
| 4,959,696 | 9/1990 | Frensley et al. | 257/15 |
| 5,010,382 | 4/1991 | Katoh | 257/15 |
| 5,059,545 | 10/1991 | Frensley et al. | 437/31 |
| 5,093,699 | 3/1992 | Weichold et al. | 257/192 |
| 5,250,826 | 10/1993 | Chang et al. | 257/192 |

OTHER PUBLICATIONS

Eisenstein et al. "Resonant tunneling in GaAs/AlGaAs double quantum wells," Surface Science 267 (1992) 377–382.

*Primary Examiner*—Carl W. Whitehead, Jr.
*Assistant Examiner*—Alice W. Tang

[57] ABSTRACT

A double electron layer tunneling device is presented. Electrons tunnel from a two dimensional emitter layer to a two dimensional tunneling layer and continue traveling to a collector at a lower voltage. The emitter layer is interrupted by an isolation etch, a depletion gate, or an ion implant to prevent electrons from traveling from the source along the emitter to the drain. The collector is similarly interrupted by a backgate, an isolation etch, or an ion implant. When the device is used as a transistor, a control gate is added to control the allowed energy states of the emitter layer. The tunnel gate may be recessed to change the operating range of the device and allow for integrated complementary devices. Methods of forming the device are also set forth, utilizing epoxy-bond and stop etch (EBASE), pre-growth implantation of the backgate or post-growth implantation.

26 Claims, 13 Drawing Sheets

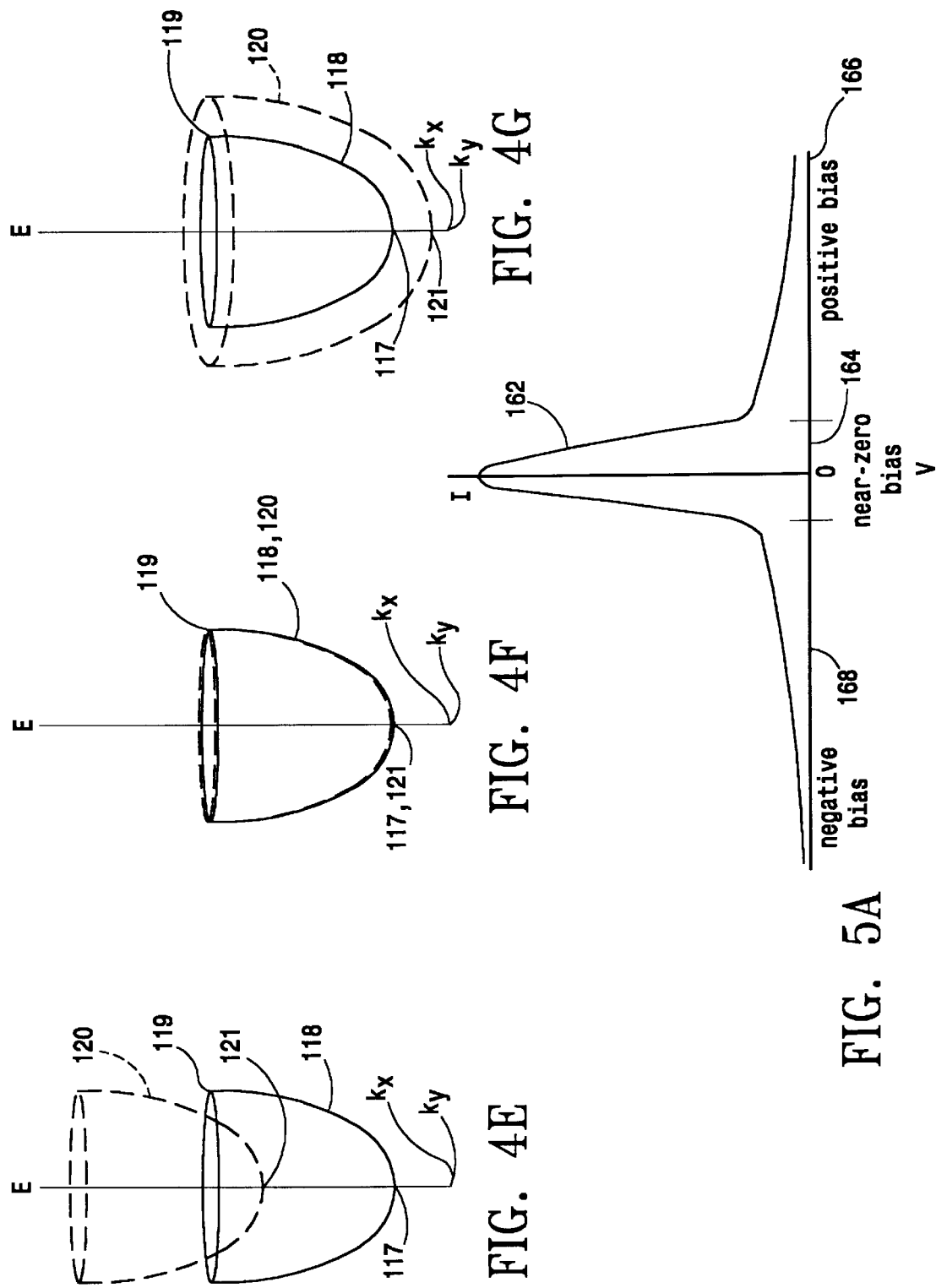

RESONANT TUNNELING DEVICE WITH TWO-DIMENSIONAL QUANTUM WELL EMITTER AND BASE LAYERS

GOVERNMENT RIGHTS

This invention was made with United States Government Support under Dept. of Energy Contract No. DE-AC04-94AL85000. The Government has certain rights in this invention.

BACKGROUND OF THE INVENTION

The present invention relates generally to the field of tunneling devices. More specifically, the present invention relates to tunneling devices whose operation is based on tunneling between two two-dimensional electron layers.

In recent years, intense efforts have been directed towards developing the next generation of electronic devices based on quantum mechanical effects such as electron resonant tunneling. Tunneling is an inherently fast physical process. In addition, devices based upon resonant tunneling often exhibit negative differential resistance, meaning that at a particular applied bias, a small (differential) increase in applied bias actually produces a decrease in the current carried. This property can be used to make oscillators. In addition, a sufficiently large negative differential resistance can allow the device to be characterized as having an off (low current) state at low input voltages, an on (high current) state at intermediate input voltages, and a second off (low current) state at high input voltages beyond the negative differential resistance region. The features associated with tunneling—i.e., negative differential resistance and an extremely rapid electron transport mechanism—could be used to improve device speed, lower device power requirements, and increase device functionality, if implemented in a practical device. In particular, the increase in functionality could allow the same circuit functions to be performed with fewer devices.

To date, the most successful device to utilize electron resonant tunneling is the resonant tunneling diode (RTD). As the name suggests, it is a two terminal device which acts somewhat like a diode, having a resistance which is non-linear with applied bias. However, the RTD also exhibits negative differential resistance (NDR), meaning there is an intermediate range of input voltages for which the current decreases with increasing bias. Due to the existence of this NDR region, the RTD has been demonstrated to be useful as a high frequency oscillator. Further, because the RTD exhibits an additional low current "off" state at high input bias, it has been shown to be useful as a variable resistor, allowing reduced power consumption in inverter circuits.

While the RTD is a useful device, it only has two terminals and is therefore limited to "passive" rather than "active" behavior; i.e. it cannot by itself produce gain. While many efforts have been made to add a third terminal to the RTD and thereby produce a transistor, to date they have all either failed or proved impractical and unreliable with present technology. Two types of approach have been tried. The first, based on making an ohmic contact to the resonant electron layer only by a combination of etching and shallow metal diffusion, has largely failed due to the extremely close tolerances required. The second, based on gating extremely narrow "quantum dot"—like RTD structures from the side, has similarly proved impractical due to the tight lateral lithographic tolerances required. Related schemes based on tunneling between laterally defined electron regions suffer similarly from extremely demanding lithographic tolerances and are at present equally impractical, as will be discussed below. We note that the most obvious method, that of simply placing a gate on the surface of the RTD's emitter and using it to tune the emitter's energy levels, must fail for the RTD. This is because a gate merely effects the surface of the bulk three-dimensional emitter, reducing its thickness while leaving the energies of the remaining electrons unchanged. It is for this reason that the more sophisticated yet ultimately impractical schemes described above were attempted.

Another disadvantage of the RTD is that while it cuts "off" sharply, it turns "on" rather gradually, as voltage increases. For logic applications this is a disadvantage, since both a sharp turn-on transition and a sharp turn-off transition are desired.

Most of the above mentioned disadvantages of the RTD are related to its structure. It is composed of (1) a thick bulk emitter region containing electrons free to move in all three dimensions, followed by (2) a narrow double barrier region having a layer of electrons confined to the plane between the two barriers and therefore free to move in only two dimensions, followed by (3) a thick bulk collector region containing electrons free to move in all three dimensions. The RTD's principle of operation relies upon three dimensional to two dimensional to three dimensional (3D-2D-3D) electron tunneling. In other words, electrons travel from the 3D emitter to the 3D collector by resonantly tunneling through the 2D resonant electron layer confined between the two barriers. In order for tunneling to occur, two conditions must be satisfied. First, occupied energy levels of the 3D emitter layer must coincide with allowed energy levels of the 2D resonant electron layer; i.e. energy must be conserved in a tunneling event. Second, the in-plane momentum of an electron tunneling from a state in the 3D emitter must coincide with the in-plane momentum of the state in the 2D resonant layer that it tunnels into; i.e. momentum must be conserved in a tunneling event. Because the density of allowed electron states in the 3D emitter is much larger than in the 2D collector, these conditions are rather easily satisfied. In fact, the slow turn-on transition of the RTD is due to a steadily increasing number of pairs of states in the emitter and collector which satisfy both conditions, as the bias is increased. The sharp turn-off transition occurs when the number of pairs of states satisfying energy and momentum conservation drops abruptly to zero from a maximum. Thus the gradual turn-on transition of the RTD is a direct result of its emitter being three dimensional.

Numerous other proposed quantum devices based on more exotic effects such as Coulomb blockade have all proved impractical due to either irreproducibility from the extremely tiny sizes required, extremely tiny signal levels, or extremely low required temperatures. The lack of a third terminal is thus a serious limitation on the usefulness of the RTD, and no practical alternative three terminal quantum device has yet been proposed.

The present invention utilizes two dimensional to two dimensional to three dimensional (2D-2D-3D) electron tunneling in a device which can be structured as a transistor with a controlling gate and which exhibits sharp turn on and turn off and improved peak-to-valley ratios over the RTD.

SUMMARY OF THE INVENTION

The present invention provides a device which utilizes two dimensional to two dimensional to three dimensional (2D-2D-3D) electron tunneling to allow use as a transistor or a diode exhibiting negative differential resistance with sharp turn on and turn off characteristics and adequate gain.

Accordingly, a double electron layer tunneling semiconductor device for two dimensional to two dimensional to three dimensional electron tunneling comprises an emitter contact, a collector contact, a two dimensional quantum well emitter layer electrically contacting the emitter contact, a two dimensional quantum well resonant tunneling layer, a collector layer disposed on the opposite side of the resonant tunneling layer from the emitter layer and electrically contacting the collector contact, barrier layers disposed between the emitter layer and the resonant tunneling layer and between the resonant tunneling layer and the collector layer for the purpose of creating a tunneling barrier between the emitter layer, the resonant tunneling layer, and the collector, a voltage drop layer between the resonant tunneling layer and the collector, means for effectively preventing electrical contact between the emitter layer and the collector contact, and means for effectively preventing electrical contact between the collector and the emitter contact. The materials and dimensions of the emitter layer, the resonant tunneling layer, the collector, the barrier layers and the voltage drop layer are chosen to permit resonant tunneling from the emitter to the resonant tunneling layer to the collector given a predetermined voltage bias applied between the emitter contact and the collector contact.

As a feature, the double electron layer tunneling semiconductor device above may also include a control gate for changing the energies of the occupied electron states in the emitter layer and an insulating layer for electrically insulating the control gate from the emitter layer, thereby controlling the predetermined voltage bias applied between the emitter contact and the collector contact to allow tunneling between the emitter layer and the resonant tunneling layer.

The means for effectively preventing electrical contact between the emitter layer and the collector contact may comprise a depletion gate, an isolation etch, or a doped implant. Similarly, the means for effectively preventing electrical contact between the collector layer and the emitter contact may comprise a depletion gate, an isolation etch, or a doped implant.

The emitter layer, the resonant tunneling layer, the voltage drop layer and the collector may comprise gallium arsenide and the barrier layers and the insulating layer may comprise aluminum gallium arsenide. In this case an optimum geometry would include having the emitter layer about 150 angstroms thick, the resonant tunneling layer around 50 angstroms thick, and the barrier layers and the insulating layer around 70 angstroms thick. Or, the resonant tunneling layer, the voltage drop layer and the collector might comprise silicon germanium and the barrier layers might comprise silicon.

The present invention provides a novel device for analog and digital applications. The present invention provides a device for construction of a unipolar complementary inverter. In addition, due to its multifunctionality, the present invention enables the practical realization of an entire new class of circuit architecture and design technology based on multi-valued logic, which has previously been theoretically developed and has awaited the development of a suitable practical multi-functional device. Additional advantages and novel features will become apparent to those of ordinary skill in the art upon examination of the following detailed description of the invention, or can be learned by practice of the present invention.

Further scope of applicability of the present invention will become apparent from the detailed description of the invention provided hereinafter. It should be understood however, that the detailed description of the invention, and the specific examples presented, while indicating embodiments of the present invention, are provided for illustration purposes only, because various changes and modifications within the spirit and scope of the invention will become apparent to those of ordinary skill in the art from the detailed description of the invention and claims that follow.

BRIEF DESCRIPTION OF THE DRAWINGS

FIGS. 4E–4G show energy-momentum diagrams of the emitter and resonant tunnel layers for the same emitter collector voltages.

FIG. 5A shows the emitter-collector current of the DELTT of FIG. 3 versus control gate voltage, at a fixed emitter-collector voltage.

DETAILED DESCRIPTION OF THE INVENTION

Figure 1:
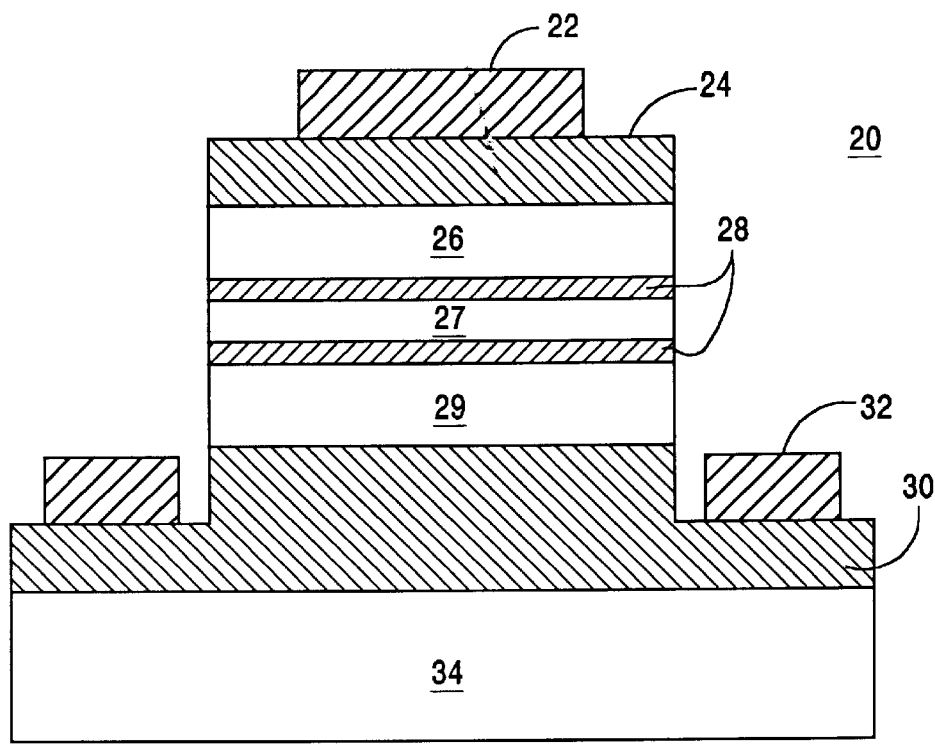
FIG. 1 (prior art) shows a side section view of a resonant tunneling diode (RTD).

Attention is now directed to FIG. 1 (prior art), where a conventional resonant tunnel diode (RTD) 20 is shown. An understanding of the structure and operation of RTD 20 will assist in understanding the present invention. RTD comprises a cathode 22, a bulk three dimensional emitter 24, undoped layer 26, a two dimensional resonant electron layer 27 confined between two thin barriers 28, undoped layer 29, a bulk three dimensional collector 30, and a substrate 34. In the present example, emitter 24 and collector 30 comprise n-type gallium arsenide, layers 26, 27, and 29 comprise undoped gallium arsenide, and barriers 28 comprise undoped aluminum gallium arsenide. Cathode 22 and anode 32 comprise metal contacts, and substrate 34 comprises semi-insulating gallium arsenide.

RTD 20 operates as follows. Electrons tunnel from emitter 24 through the two barriers 28 and the resonant electron layer 27 to collector 30. Tunneling can only occur when some of the energies of the occupied electron states of emitter 24 coincide with the energies of the (unoccupied) electron states of the resonant tunneling electron layer 27. However, once the electrons gain momentum moving from emitter 24 to resonant layer 27, they will continue to move to collector 30 (which is at a lower potential) because of the large density of allowed states at the same energy in collector 30. The energy of the allowed states of emitter 24 are determined by the bias applied between emitter 24 and collector 30.

Figure 2:
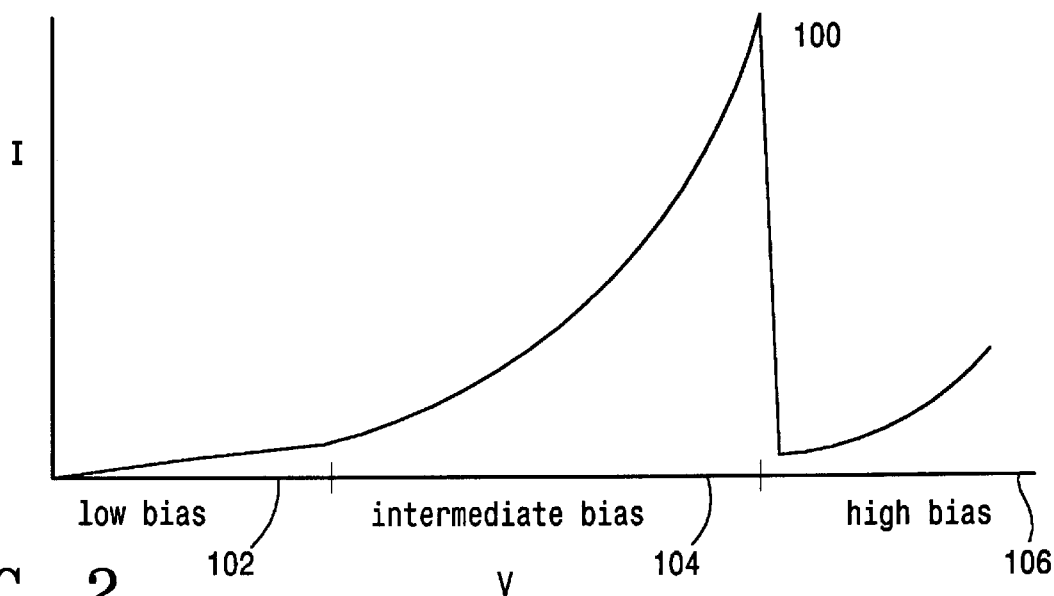
FIG. 2A (prior art) shows the emitter-collector current of the RTD versus emitter-collector voltage.
FIGS. 2B–2D (prior art) show energy-distance diagrams of the RTD for various emitter-collector voltages.
FIGS. 2E–2G (prior art) show energy-momentum diagrams of the emitter and resonant tunnel layers for the same respective emitter-collector voltages.

FIGS. 2A–2G show the operation of RTD 20. FIG. 2A shows a plot 100 of the output current of RTD 20 versus input bias (or voltage) between emitter 24 and collector 30. The current versus voltage diagram is divided into three portions, designated low bias 102, intermediate bias 104, and high bias 106.

Figure 2B:
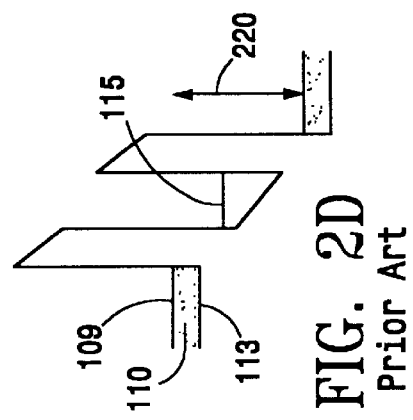
Figure 2C:
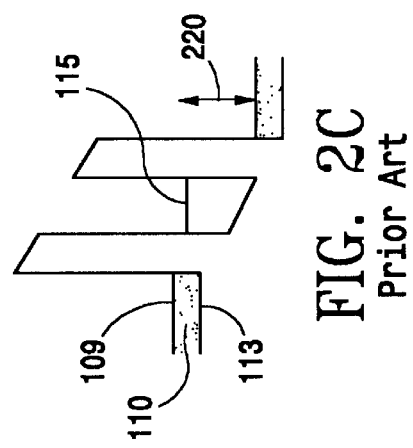
Figure 2D:
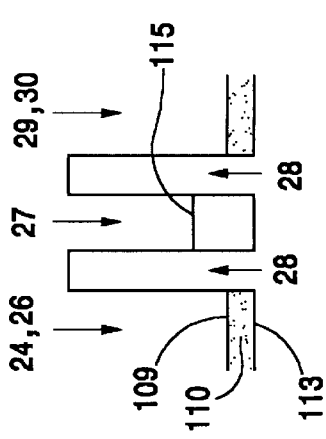
Figure 2E:
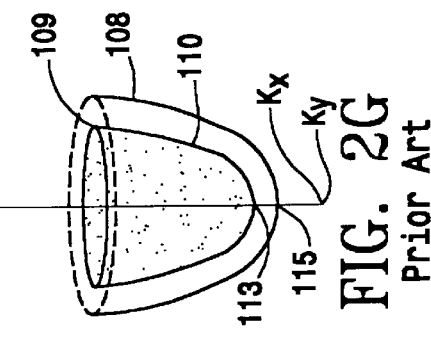
Figure 2F:
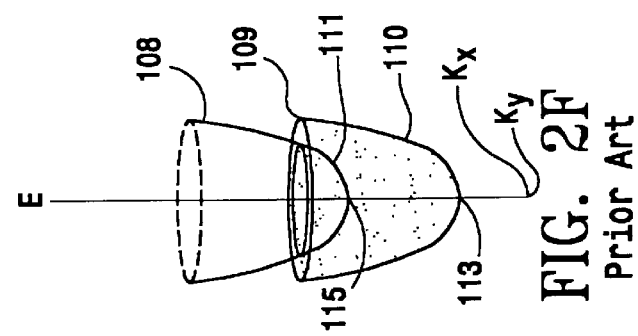
Figure 2G:
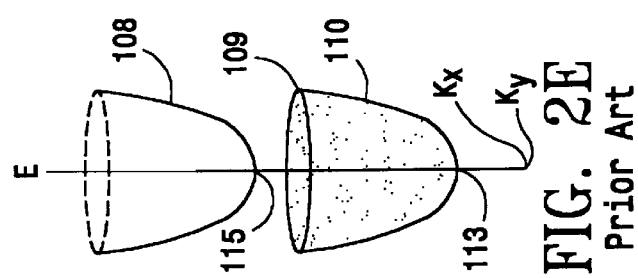

At low bias, RTD 20 is off, and little current flows. This can be understood by referring to the energy-distance diagram of FIG. 2B, and to the corresponding energy-momentum diagram of FIG. 2E. In FIGS. 2B–2D the vertical axis represents electron energy (or potential) while the horizontal axis represents distance along the growth direction. In FIGS. 2E–2G the vertical axis represents energy (E), while the two horizontal axes represent momentum in the x-direction (kx) and in the y-direction (ky) respectively, which both lie in the growth plane. Because the controlling factor in electron tunneling is the simultaneous conservation of energy and transverse momentum, graphing the states of the emitter and resonant tunneling layer in energy-momentum space in this manner allows one to determine the extent of tunneling and hence current flow. Since emitter 24 is three dimensional, its allowed energy states form a solid paraboloid 110 (like a dish full of water). The allowed states in the emitter 24 are occupied by electrons up to the emitter Fermi level 109 (like the surface level of the water in the dish). Electrons in the three dimensional emitter are free to move in all directions, so for every value of kx and ky, a continuum of kz values are allowed. Points in the interior of the paraboloid represent non-zero values of kz. Resonant electron layer 27, however, is a quantum well confined between the two barriers 28. The electron states are confined in the z direction, requiring kz=0. As a result, its allowed energy states form a surface 108 (like an empty dish).

At low bias range 102, shown in FIGS. 2B and 2E, low bias is applied between emitter 24 and collector 30, and the emitter's occupied energy states 110 are all lower than the resonant energy states 108. No electrons tunnel through barriers 28 to collector 30, neglecting the small amount of higher order tunneling events such as those involving phonon interactions.

At intermediate bias range 104, RTD 20 turns on gradually with increasing bias between emitter 24 and collector 30. FIGS. 2C and 2F show how this occurs. The energies of the (unoccupied) resonant tunneling states 108 drop as the voltage 220 between emitter 24 and collector 30 increases. The lowest energy edge 115 of the resonant energies 108 eventually touches the Fermi level 109 of the occupied emitter energies 110, at which point tunneling and hence current flow begins to occur. As the bias is further increased, the resonant tunneling energies 108 gradually increase their intersection 111 with the occupied emitter energies 110. The intersecting surface 111 between 108 and 110 represents pairs of states, comprising an occupied state in the emitter 110 and an empty state in the two-dimensional resonant layer 108, which have the same energy and in-plane momentum and hence can participate in a tunneling event. The more intersection between emitter energy 110 and resonant energy 108, the more pairs of energy states of identical energy and momentum exist, and the more electrons travel to collector 30.

Although the RTD turns on slowly, it turns off abruptly at the cutoff between intermediate bias 104 and high bias 106. How this occurs is shown in FIGS. 2D and 2G. As the voltage 220 between the emitter and collector increases, eventually the resonant tunneling energies 108 drop enough that they no longer intersect the emitter energies 110. Emitter 24 and barrier 28 no longer have any common allowed energy states of identical energy and in-plane momentum. For the case when electrons in the emitter 24 and resonant tunneling layer 27 have the same mass, this occurs when the lowest energy state 115 of the resonant tunneling energies 108 drops below the lowest energy state 113 of the emitter energies 110. The full bowl (emitter energy 110) is now inside, but not touching, the empty bowl (resonant energy 108).

Figure 3:
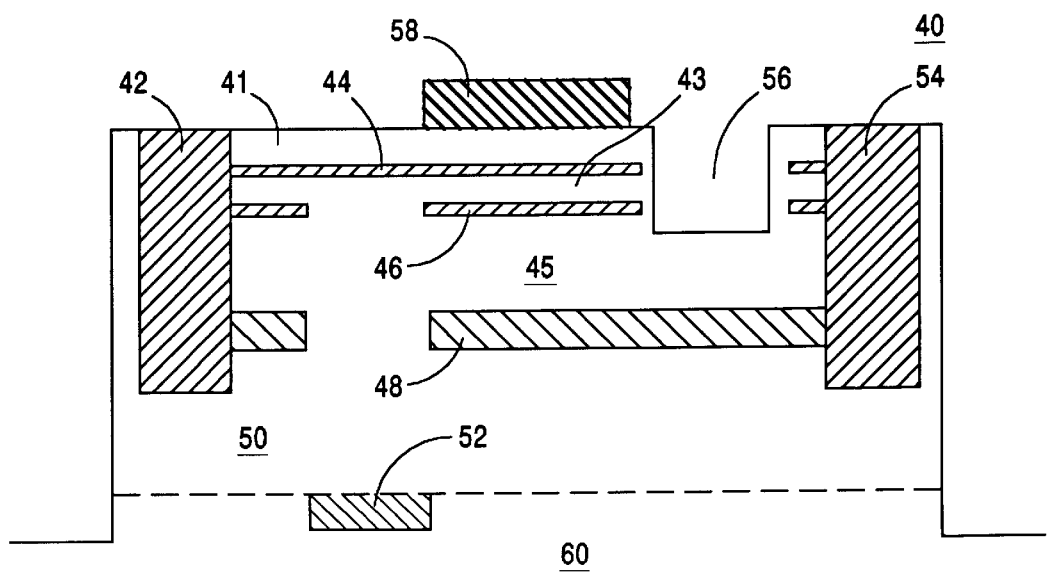
FIG. 3 shows a side section view of one embodiment of a double electron layer tunneling transistor (DELTT) according to the present invention.

FIG. 3 shows a side section view of a double electron layer tunneling transistor 40 (DELTT). It comprises a two dimensional emitter layer 44, a two dimensional resonant tunneling layer 46, and a collector 48, which are typically composed of gallium arsenide. In addition, it comprises an insulating layer 41 above emitter 44, a barrier layer 43 between emitter 44 and resonant layer 46, and a barrier and voltage drop layer 45 between resonant layer 46 and collector 48, which are typically composed of aluminum gallium arsenide. The doping of these layers is done appropriately so as to populate the emitter 44 and collector 48 with electrons, and may be done either by direct doping of these two layers, or by modulation of adjacent layers. It also comprises an emitter contact 42 and a collector contact 54, which are typically composed of metal diffused into the epitaxially grown semiconductor layers. An isolation etch 56 prevents electrons from traveling directly from emitter contact 42 to collector contact 54 via emitter 44. (This could also be achieved by a surface gate to deplete and thus effectively create a gap in the emitter layer 44 and resonant tunneling layer 46, as shown in the embodiment of FIG. 6E.) A backgate 52 effectively creates a gap in resonant tunneling layer 46 and collector 48. (This could also be achieved be either an isolation etch, or by an ion-implant as shown in the embodiment of FIG. 7D.) The control gate 58 controls DELTT 40, somewhat in the manner of a field effect transistor.

Epitaxially grown buffer layer 50 is typically composed of aluminum gallium arsenide, but may also contain layers of gallium arsenide as is typical in standard buffer layers, and serves to electrically insulate the backgate 52 from the collector 48, emitter 42, and resonant tunneling layer 46. Substrate 60 is typically semi-insulating gallium arsenide.

DELTT 40 operates as follows. A bias (generally the input voltage to the device) is applied between emitter contact 42 and collector contact 54. Additionally, voltage is applied to control gate 58 so as to turn DELTT 40 on or off by changing the energies of the occupied electron states of two dimensional emitter layer 44. Because of the electrical screening provided by emitter 44, control gate 58 is relatively ineffective in changing the energies of electron states in resonant tunnel layer 46. Since tunneling current will only flow in the region between backgate 52 and isolation etch 56, the control gate 58 need only cover this region. If emitter 44 and resonant layer 46 have allowed energy-momentum states in common, electrons tunnel from emitter 44 to resonant layer 46, and continue traveling to collector 48, which then carries the electrons to collector contact 54. Collector 48 is important because, in a practical device, the voltage drop from source to drain must be greater than the gate voltage required to switch between on and off states, to permit compatible input and output voltages and enable a device gain greater than unity. In DELTT 40, this is accomplished by having a region of large voltage drop 45 between resonant tunnel layer 46 and collector layer 48, which enables a large emitter-collector voltage while at the same time that the tunneling is 2D—2D in nature.

The dimensions of the growth layers of DELTT 40 of FIG. 3 are important to the correct functioning of the device. Insulating layer 41 is sufficiently thick that no current can flow between control gate 58 and emitter 44, typically 600 angstroms or greater. Emitter 44 is sufficiently thin that only one two dimensional electric subband is occupied, optimally around 150 angstroms thick. Barrier 43 is sufficiently thin that electrons can easily tunnel through it, yet thick enough that leakage current in the high bias off-state is low, optimally around 75 angstroms thick. Resonant layer 46 is sufficiently thin that the lowest electric subband is higher in energy than that of emitter 44 when no bias is applied between the emitter 44 and collector 48, and that the electric subband spacing is large compared to typical changes induced in its potential by biasing the control gate 58, optimally around 70 angstroms. Barrier and voltage drop layer 45 is typically composed of two layers, an aluminum gallium arsenide barrier sufficiently thin that electrons can easily tunnel through it, around 50 angstroms, followed by a voltage drop region next to the collector typically composed of gallium arsenide and sufficiently thick that a large voltage drop of order one volt can be maintained between the resonant layer 46 and the collector 48 without electric breakdown of the semiconductor material, to allow sufficient gain in the device. While this thickness is not as important as the others, it is typically a few hundred angstroms. The thickness of collector 48 is also relatively unimportant, and need only be sufficiently thick that it is highly conducting, in order for the device to operate at high speed, typically a few hundred angstroms. Buffer layer 50 must contain layers of aluminum gallium arsenide sufficiently thick that they are insulating, so that no current can flow between backgate 52 and collector 48. The lateral dimensions of DELTT 40 will preferably be similar to those typically found in integrated MOSFETs, to allow sufficient device speed. Gate lengths and gate-contact spacings will thus be typically around 1 micron.

DELTT 40 could also be fabricated using other semiconductor material systems, with large band gap materials playing the role of the aluminum gallium arsenide layers and small band gap materials playing the role of the gallium arsenide layers. For example, silicon could replace the aluminum gallium arsenide, and silicon germanium could replace the gallium arsenide elements. The thicknesses of the layers would then need to be adjusted take account of the differing electron effective masses and conduction band offsets in the new material system, so that the layers can behave equivalently.

Figure 4A:
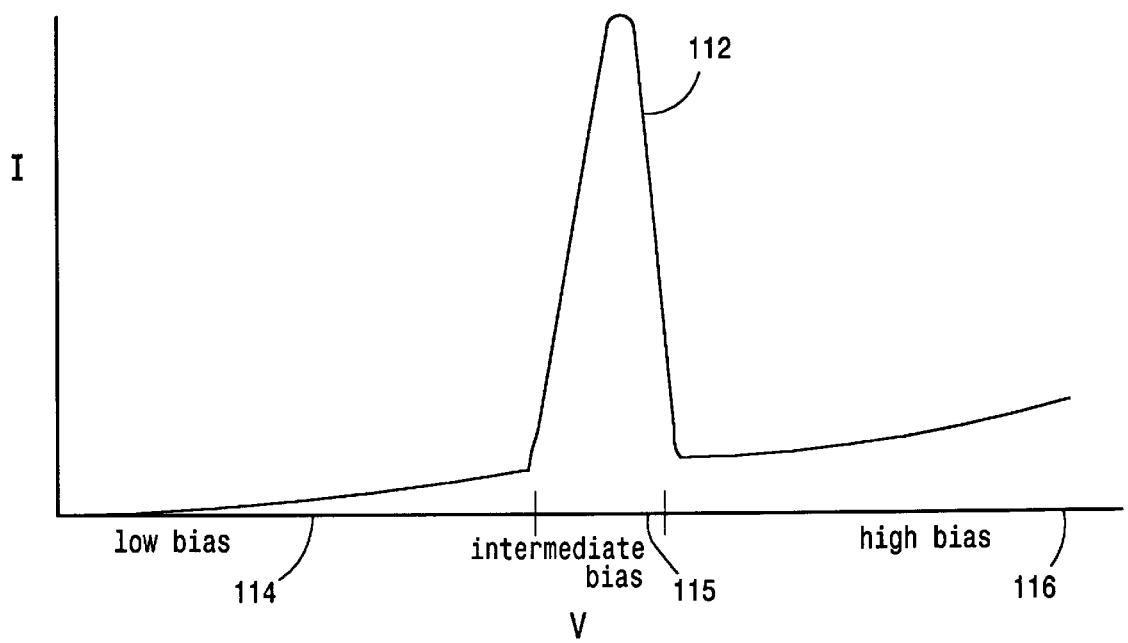
FIG. 4A shows the emitter-collector current of the DELTT of FIG. 3 versus emitter-collector voltage, at a fixed control gate voltage.
Figure 4B:
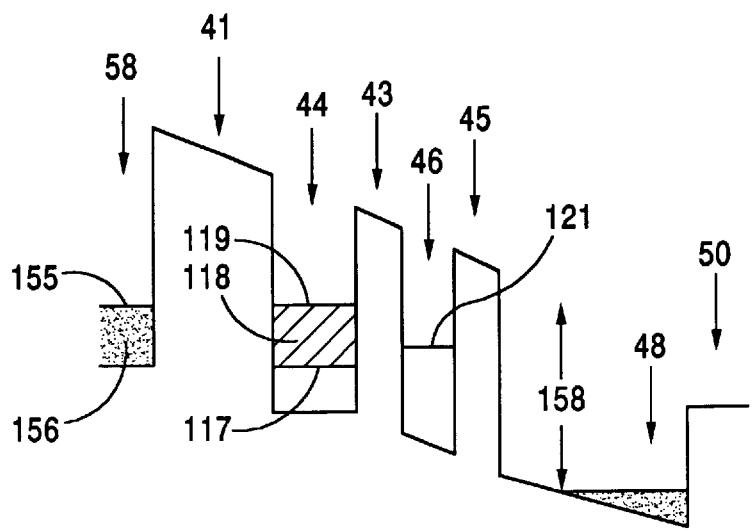
FIGS. 4B–4D show energy-distance diagrams of the DELTT for various emitter-collector voltages.
Figure 4C:
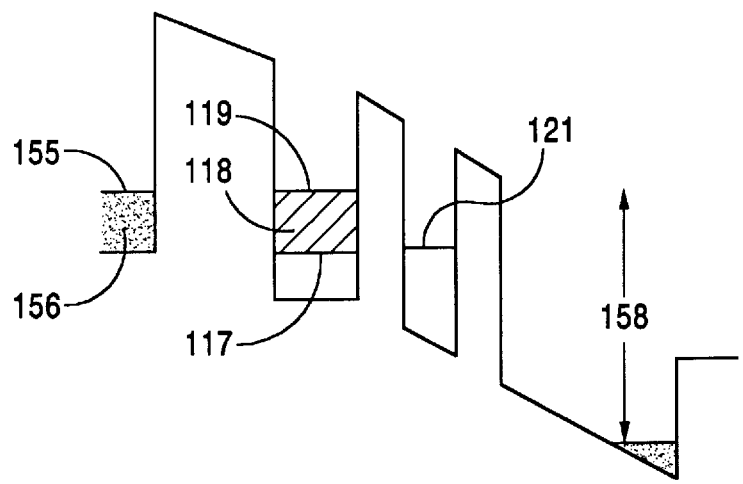
Figure 4D:
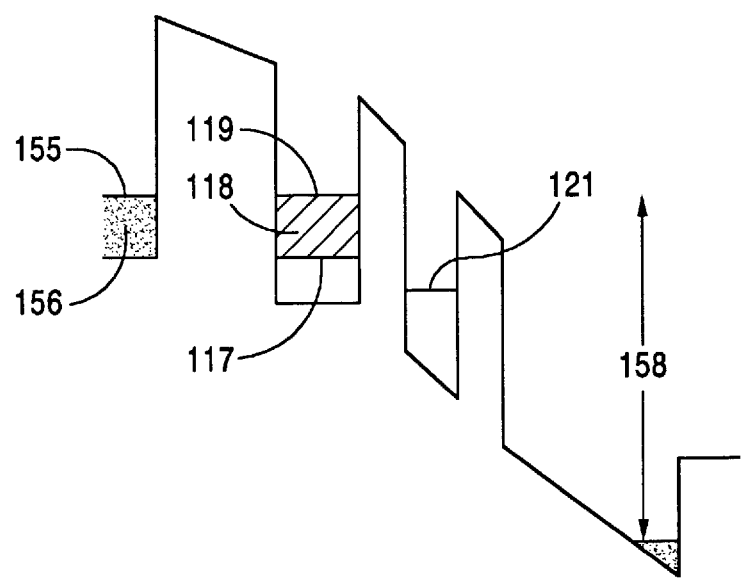

FIGS. 4A–4G show the operation of DELTT 40. FIG. 4A shows a plot 112 of the current between emitter 44 and collector 48 of DELTT 40 versus input bias (or voltage) between emitter 44 and collector 48, for the case of a fixed applied bias to the control gate 58. The current versus voltage diagram is divided into three portions, designated low bias 114, intermediate bias 115, and high bias 116. FIGS. 4B–4D show energy-distance (or energy band) diagrams of DELTT 40 under low, intermediate, and high emitter-collector bias, respectively, all for the case of zero bias (or some fixed bias) applied between control gate 58 and emitter 44. Those skilled in the art will appreciate that these diagrams are the key to building a device which operates as desired. 155 indicates the Fermi level of control gate 58, 156 indicates electrons in the control gate, and 158 is the bias applied between emitter 44 and collector 48. FIGS. 4E–4G show energy-momentum diagrams of the allowed energy states 118 of the two dimensional emitter 44, which are occupied up to the emitter Fermi level 119 and have lowest energy states 117, and also the allowed energy states 120 of the resonant tunneling layer 46, which has lowest energy states 121.

At low bias 114, DELTT 40 is off, and little current flows. This can be understood by referring to the energy-distance diagram of FIG. 4B and energy-momentum diagram of FIG. 4E. Unlike RTD 20, the emitter layer 44 of DELTT 40 is two dimensional. Therefore, its allowed energy states 120 form in energy-momentum space a parabolic surface that is hollow (like an empty dish) rather than filled. (see FIG. 4E) The electron states 120 in the emitter layer 44 are occupied by electrons up to emitter Fermi level 119 (corresponding to the rim of the empty dish). Resonant tunneling layer 46 is also a quantum well, so its allowed energy states 118 also form a hollow parabolic surface in energy-momentum space (like an empty dish). Unlike for RTD 20, even when the lowest energy states 121 of the resonant tunneling layer states 120 are lower in energy than the emitter Fermi level 119, no electrons can tunnel. As the bias is increased within the low-bias range, resonant energies 118 gradually overlap emitter energies 120, but since they are both hollow surfaces, there is no intersection, meaning there are no pairs of occupied energy states in the emitter 44 and empty states in resonant tunnel layer 46 which have both identical energy and momentum. As shown in FIG. 4E, this is because no states exist in the interior of the paraboloid of emitter states 118, and so there exist no pairs of occupied states in the emitter and resonant layer with the same energy and momentum that can participate in tunneling. (Although pairs exist with the same energy, their momentum is different.) Hence no electrons can tunnel from emitter 44 to resonant tunnel layer 46 and thence to collector 48, (neglecting the small amount of higher order tunneling events such as those involving phonon interactions). Thus, in contrast to RTD 20, the low bias condition 114 for DELTT 40 exists whenever the lowest energy resonant tunneling states 121 are above the lowest energy emitter states 117.

At intermediate bias range 115, DELTT 40 turns on suddenly as the bias between emitter 44 and collector 48 reaches the transition between low bias 114 and intermediate bias 115. FIGS. 4C and 4F show how this occurs. Resonant tunneling layer energies drop as the voltage between emitter 44 and collector 48 increases. Eventually the lowest energy resonant tunneling states 121 become equal in energy to the lowest energy emitter states 117, as shown in FIG. 4C. As shown in FIG. 4F, at this point the entire paraboloid of allowed resonant tunneling energies 120 coincides with (or touches at all points) the paraboloid of occupied emitter energy states 118. Thus there is a sudden increase from zero to a large number of pairs of occupied emitter energy states and resonant tunneling layer states with identical energy and momentum. All such pairs of states can participate in tunneling, and so a large current flows and DELTT 40 turns on very sharply. The sharpness of the turn-on transition is enhanced due to the fact that the paraboloid of emitter energies 118 and that of resonant energies 120 have the same curvature. This is because electrons in these two layers have the same effective mass.

DELTT 40 also turns off abruptly at the cutoff between intermediate bias 115 and high bias 116. FIGS. 4D and 4F show how this occurs. As the bias is increased beyond the intermediate range 115 into the high range 116, the lowest energy resonant tunneling states 121 drop below the lowest energy emitter states 117, as shown in FIG. 4D. The paraboloid representing the energies of the resonant states 120 thus drops below the paraboloid representing the energies of the emitter states 118. Thus the two paraboloids no longer intersect, and the number of pairs of occupied emitter energy states and resonant tunneling layer states with identical energy and momentum drops abruptly to zero. Thus no electrons can tunnel, and the current from emitter 44 to collector 48 also drops abruptly to zero.

FIGS. 4E–4G thus show that current only flows through DELTT 40 when the lowest resonant tunnel energy states 121 coincide with the lowest emitter energy states 117. In practice, this requirement will be loosened slightly by the energy uncertainty of electrons, which will be determined by their scattering rate in the quantum wells, which is determined by their mobility. In general, the higher the mobility of the quantum wells of the emitter 44 and resonant layer 46, the sharper will be the tunneling peak in the I-V curve 112, and the narrower the region of intermediate bias 115.

Figure 5B:
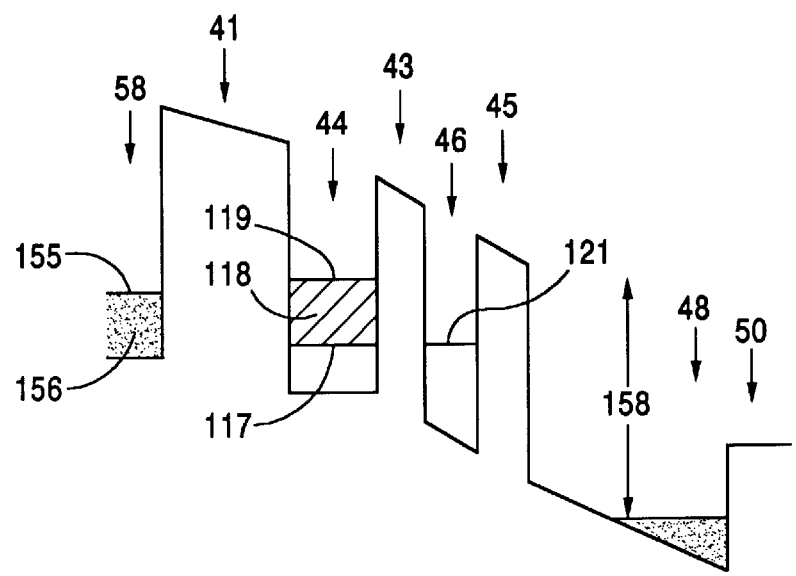
FIGS. 5B–5D show energy-distance diagrams of the DELTT for 0, positive, and negative control biases.
Figure 5C:
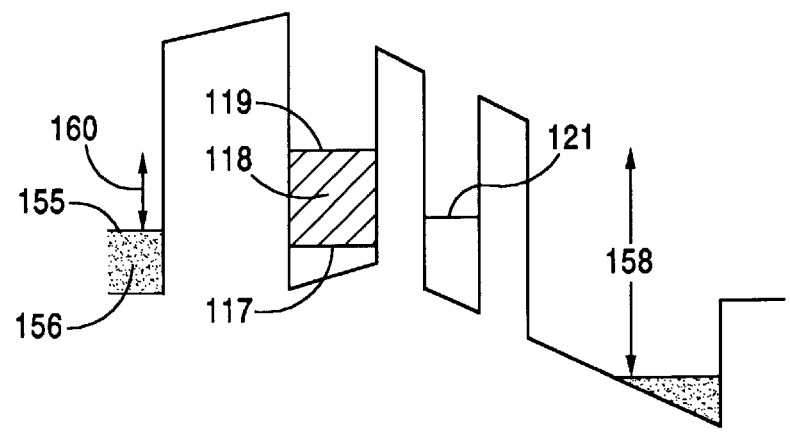
Figure 5D:
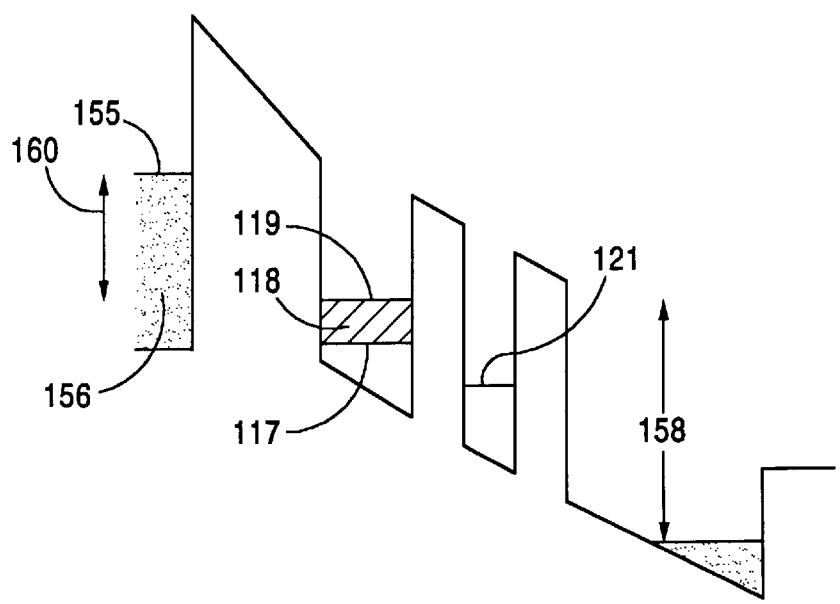
Figure 5G:
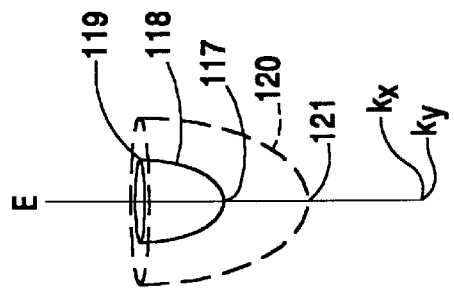
FIGS. 5E–5G show energy-momentum diagrams of the emitter and resonant tunnel layers for 0, positive, and negative control biases.
Figure 5F:
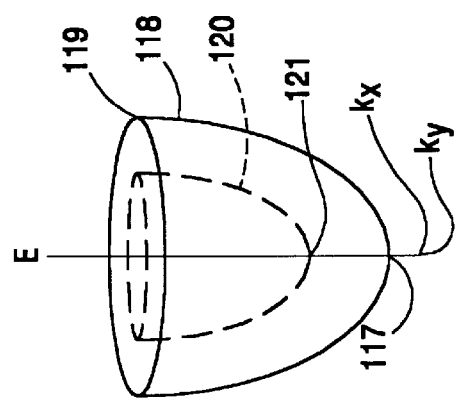
Figure 5E:
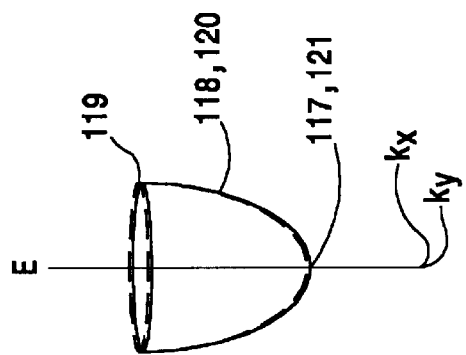

FIGS. 4A–G showed the effect of changing the voltage between emitter 44 and collector 48 while holding the voltage on control gate 58 constant. FIGS. 5A–G show the effect of changing the voltage on control gate 58 (defined relative to the emitter 44) while holding the voltage between emitter 44 and collector 48 constant. (The emitter-collector voltage in these diagrams is chosen so that DELTT 40 is on when there is zero bias on control gate 58.) FIG. 5A shows a plot 162 of the current between emitter 44 and collector 48 as a function of voltage on control gate 58, and is divided into regions of near zero bias 164, positive bias 166, and negative bias 168. FIGS. 5B–5D show energy-distance (or energy band) diagrams of DELTT 40 for zero, positive, and negative bias on control gate 58 respectively, and are labeled similarly to FIGS. 4B–4D except that the voltage 160 between control gate 58 and emitter 44 is also indicated. FIGS. 5E–5G are energy-momentum diagrams of DELTT 40 for zero, positive, and negative bias on control gate 58 respectively, and are labeled similarly to FIGS. 4E–4G.

FIG. 5B shows the energy-distance diagram of DELTT 40 with zero bias on control gate 58. Because the control gate bias is zero, the control gate Fermi level 155 lines up with the emitter Fermi level 119. Because the emitter-collector voltage 158 is biased so DELTT 40 is on, the lowest energy resonant tunneling states 121 line up with the lowest energy emitter states 117. As shown in FIG. 5E, this means that the paraboloids representing the occupied emitter energies 118 and the allowed resonant tunneling energies 120 coincide, allowing tunneling to occur and causing a large current to flow in this near-zero bias region 164, corresponding to the DELTT 40 being on.

FIG. 5C shows the effect of a positive voltage 160 on the control gate 58. The positive bias 160 lowers the control gate Fermi level 155, and produces an electric field on the emitter 44. Since emitter layer 44 is two dimensional, its density is easily modulated by the electric field produced by control gate 58. The electric field thus lowers the lowest energy emitter states 117. As shown in FIG. 5F, this has the effect of lowering the paraboloid representing the emitter energies 118 and making it larger, so that these energies now no longer coincide in energy-momentum space with the allowed resonant tunneling energies 120. This reduces to zero the number of pairs of energy states in emitter 44 and resonant tunnel layer 46 with the same energy and momentum, meaning no tunneling can occur. The current thus drops sharply towards zero in the positive bias region 166, corresponding to the DELTT 40 being off.

FIG. 5D shows the effect of a negative voltage 160 on the control gate 58. The negative bias 160 raises the control gate Fermi level 155, and produces an electric field on the emitter 44 which in turn laises the lowest energy emitter states 117. As shown in FIG. 5G, this has the effect of raising the paraboloid representing the emitter energies 118 and making it smaller, so these energies now no longer coincide in energy-momentum space with the allowed resonant tunneling energies 120. This reduces to zero the number of pairs of energy states in emitter 44 and resonant tunnel layer 46 with the same energy and momentum, meaning no tunneling can occur. The current thus drops sharply towards zero in the negative bias region 168, corresponding to the DELTT 40 being off.

To summarize, changing the voltage on tunnel gate 58 changes the resonant emitter-collector voltage of DELTT 40. As was demonstrated in FIGS. 5A–5F, the DELTT 40 is a device in which a small change in the voltage on the control gate 58 produces a large change in the current flowing between the emitter 44 and collector 48, enabling a quantum tunneling transistor which can produce power gain when properly configured in a circuit. This is made possible by the two dimensional nature of the emitter 44, which (1) allows its energies to be easily modulated by a control gate 58, and (2) causes the conditions under which tunneling into the two dimensional resonant tunneling layer 46 can occur, to be considerably restricted in comparison to the RTD, producing much sharper turn-on and turn-off transitions.

Figure 6B:
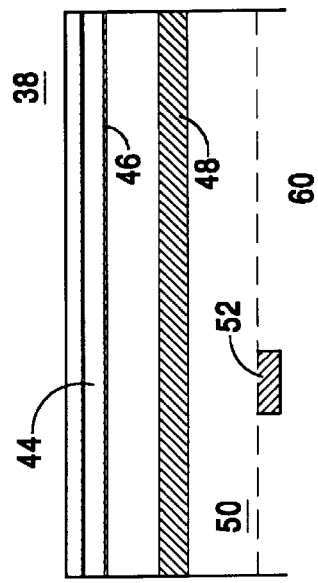
FIGS. 6A–6E show a fabrication sequence for a second embodiment of a DELTT using a pre-growth implanted backgate.
Figure 6A:
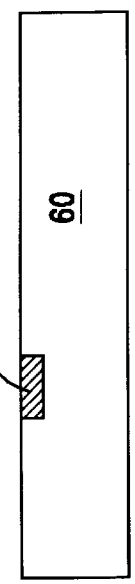
Figure 6C:
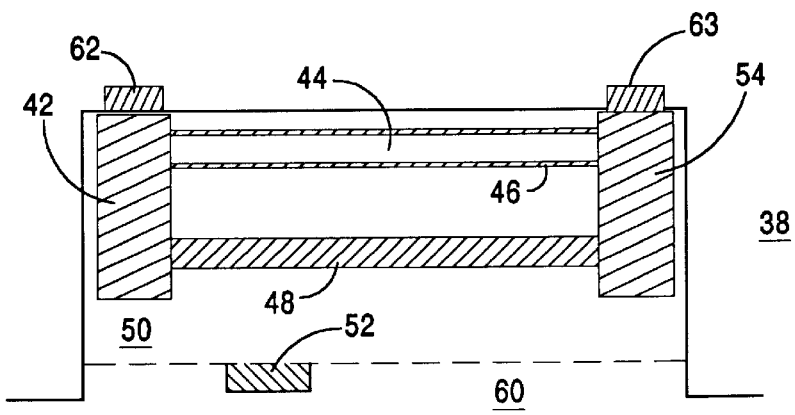
Figure 6D:
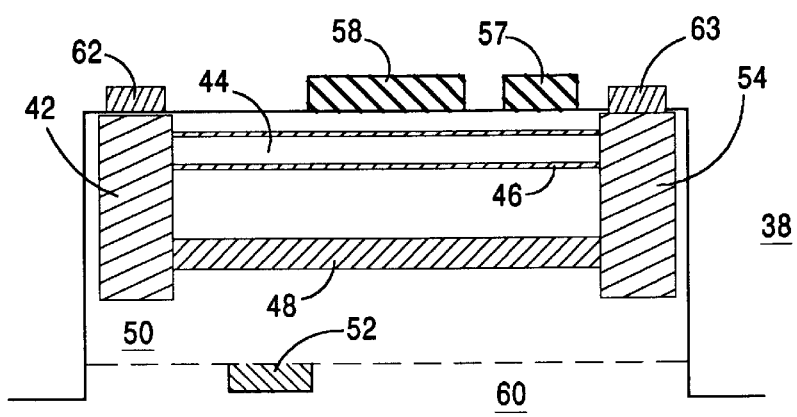
Figure 6E:
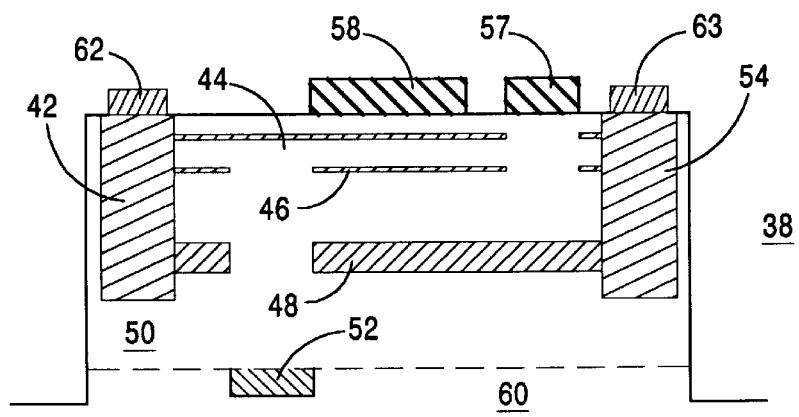

FIGS. 6A–E show a fabrication sequence for a DELTT 38 using a pre-growth implanted backgate and a top-surface depletion gate. DELTT 38 is very similar to DELTT 40, except that it utilizes a depletion gate 57 in place of isolation etch 56 to prevent electrical contact between the emitter 44 and the collector contact 54. FIG. 6A shows the implant and anneal of backgate 52 into insulating substrate 60. The implant is limited to the region of backgate 52 either by (1) use of a spatially focused ion beam, or (2) masking of a blanket implant by either a shadow mask or by placing a patterned masking layer (e.g. of photoresist, silicon oxide, or silicon nitride) on the substrate 60 before the implant, and then removing it afterwards. Substrate 60 is a standard wafer (about 600 microns thick) of insulating (undoped) silicon or gallium arsenide. Backgate 52 is formed by using a sufficiently dense implant that small region of substrate 60 becomes highly conducting. Generally, the implanted region can either be made n-type by implanting silicon, or p-type by implanting beryllium or zinc. The substrate 60 and backgate 52 are then annealed at high temperature (of order 800 Celsius) to remove damage to the semiconductor lattice structure caused by the implant process.

FIG. 6B shows epitaxial growth of the DELTT structure. Any standard epitaxial growth techniques may be used to grow the gallium arsenide and aluminum gallium arsenide layers, or equivalent layers in other semiconductor material systems, to specification. This includes, but is not limited to, molecular beam epitaxy (MBE) and metal-organic chemical vapor deposition (MOCVD).

FIG. 6C shows the formation of emitter contact 42 and collector contact 54. Methods for forming the contact include, but are not limited to of a suitable contact metal 62 for the emitter and a suitable contact metal 63 for the collector. The structure is then annealed to cause the metals 62 and 63 to diffuse into the semiconductor, forming the emitter contact 42 and collector contact 54. The annealing temperature of this step is at a low enough temperature that it has no effect on backgate 52.

FIG. 6D shows the formation of control gate 58 and depletion gate 57. Methods of forming these gates include, but are not limited to, evaporation and lift-off of a suitable metal, or etching of a metal overlayer. These gates are typically not annealed.

FIG. 6E shows the effect of gates 52 and 57, when voltage is applied to the gates so as to bring the DELTT into the configuration required for proper operation. Collector 48 and resonant layer 46 show electrostatic depletion over backgate 52. Emitter 44 shows electrostatic depletion under depletion gate 57. Voltage is applied to backgate 52 by a forming a contact through a via, formed by etching a hole (not shown) from the top surface of the structure down to gate 52 using a suitable wet chemical or dry etch. The via may then either be directly contacted electrically through placement of a contact wire, or may first be filled with a suitable conducting metal. The via hole is placed at a location sufficiently far away from the electrical conduction path through emitter layer 44 that it does not interfere with the operation of the device.

Figure 7A:
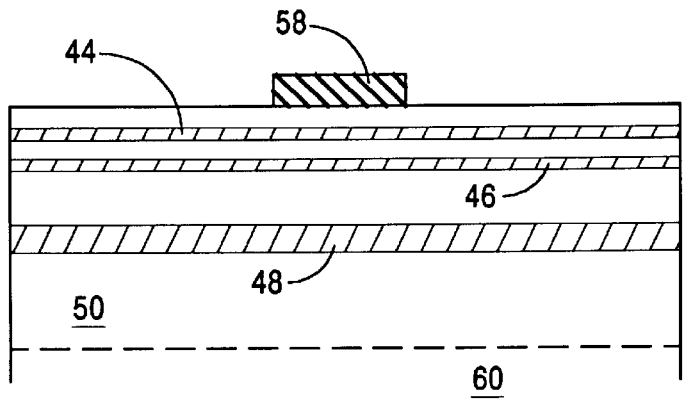
FIGS. 7A–7D show a fabrication sequence for a third embodiment of a DELTT using post-growth implantation and a self-aligned isolation etch.
Figure 7B:
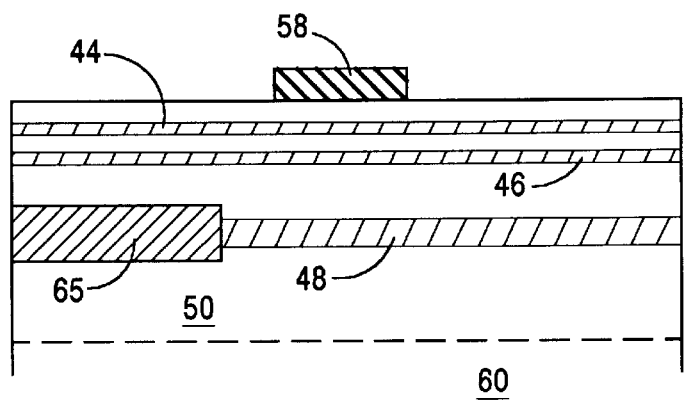
Figure 7C:
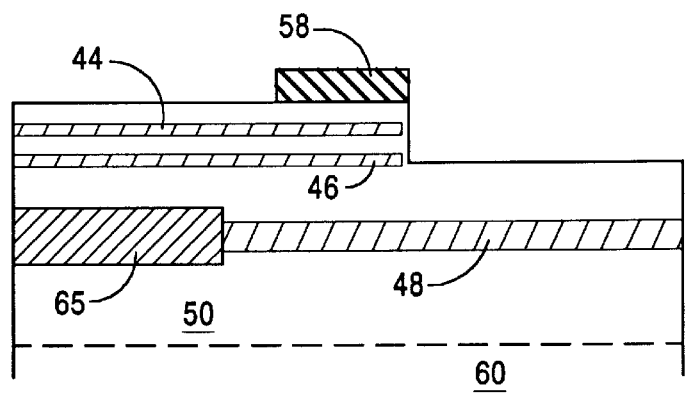
Figure 7D:
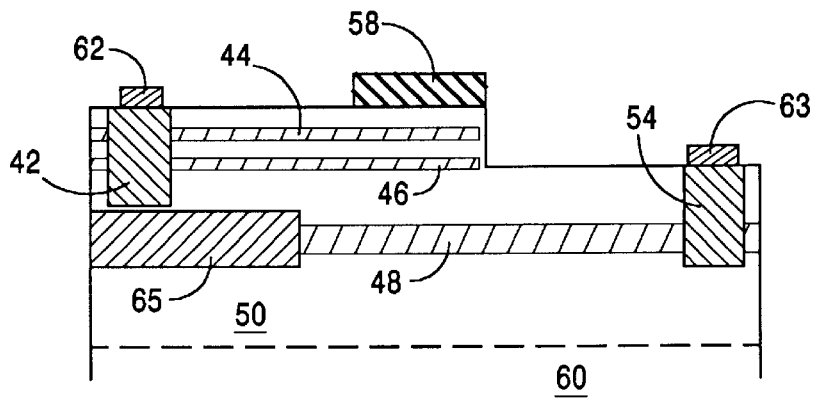

FIGS. 7A–D show a fabrication sequence for a DELTT 39 using a post-growth implanted backgate. DELTT 39 is very similar to DELTT 40, except that (1) it utilizes an ion-implant 65 to break the conduction path between collector 48 and emitter contact 42, and (2) it uses a self-aligned isolation etch to break the conduction path between emitter 44 and collector contact 54. (The implant may optionally also be self-aligned.) FIG. 7A shows epitaxial growth of the DELTT structure and the formation of control gate 58. FIG. 7B shows a self-aligned deep p-type implant 65 and anneal. Implant 65 is ion implanted from the top of the device. Implant 65 can break the current path by either (1) causing sufficient damage to that region of collector 48 that electrons are localized and can no longer carry current, in which case the implant can be either n-type or p-type, or (2) forming a p-n junction with collector 66 and thus a depleted region at their junction which contains no electrons and cannot carry current, in which case the implant must be sufficiently p-type that the implanted region 65 is p-type. It is not necessary in this device to interrupt resonant tunneling layer 46, because the layer has only unoccupied electron states and will be unable to carry current.

FIG. 7C shows self-aligned surface etching to deplete emitter layer 44 (and optionally also resonant tunneling layer 46). This interrupts emitter 44 to prevent current from flow from emitter 44 directly to collector contact 54 Alternatively, a depletion gate could be used as was done in FIG. 6E. FIG. 7D shows deposition and anneal of suitable contact metals 62 and 63 to form the emitter contact 42 and collector contact 54.

FIGS. 8A–8D show a fabrication sequence for a DELTT 129 using an epoxy bond and stop etch (EBASE) technique.

Figure 8A:
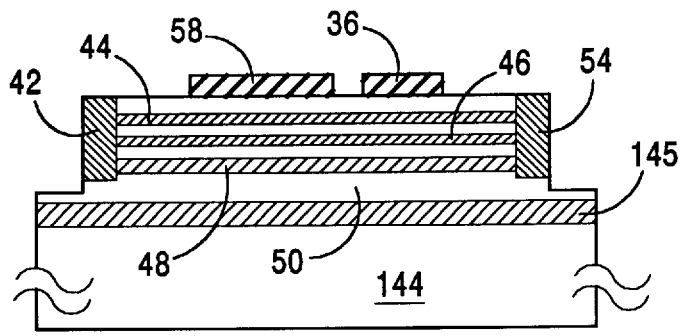
FIGS. 8A–8D show a fabrication sequence for a fourth embodiment of a DELTT using an epoxy-bond-and-stop-etch (EBASE) technique.

FIG. 8A shows sacrificial substrate 144 with a stop etch layer 145 epitaxially grown on its top surface. The stop etch layer is composed of a semiconductor layer which may be epitaxially grown on the substrate, yet for some chemical etchants exhibits an etch rate substantially slower than that of the sacrificial substrate 144. For a DELTT formed in the gallium arsenide/aluminum gallium arsenide material system, the stop etch layer is typically aluminum gallium arsenide of high aluminum content and a few thousand angstroms thick. The DELTT structure is then epitaxially grown on the stop etch layer 145, and is very similar to the growth structure of DELTT 40, including an insulating buffer layer 50, collector 48, resonant layer 46, and emitter 44. Collector contact 54 and emitter contact 42 are then formed, and backgate 36 and control gate 58 are placed on the top surface. The contacts are formed during this step in order to avoid annealing the structure after application of the adhesive layer, which may suffer deleterious effects from annealing. With an adhesive sufficiently resistant to high temperatures, contact formation could alternatively be done after application of the adhesive layer.

Figure 8B:
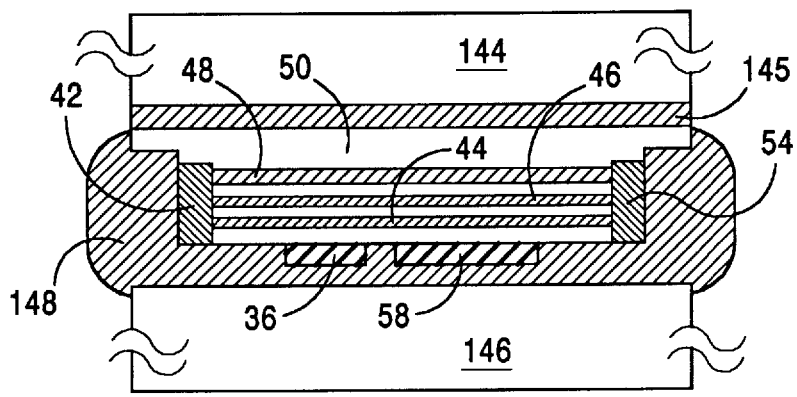
Figure 8C:
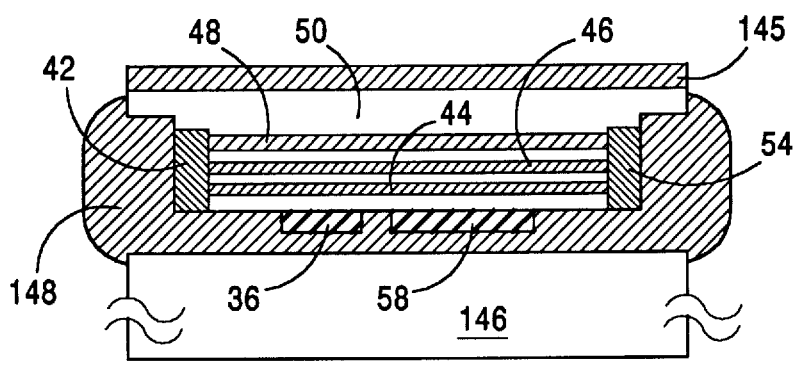

FIG. 8B shows the structure flipped over and bonded front-side-down to host substrate 146 (typically gallium arsenide) using an adhesive layer 148 (typically heat-cured epoxy). In FIG. 8C, sacrificial substrate 144 is etched off to reveal stop etch layer 145, yielding a smooth surface in close proximity to the collector layer on which depletion gates may easily be placed.

Figure 8D:
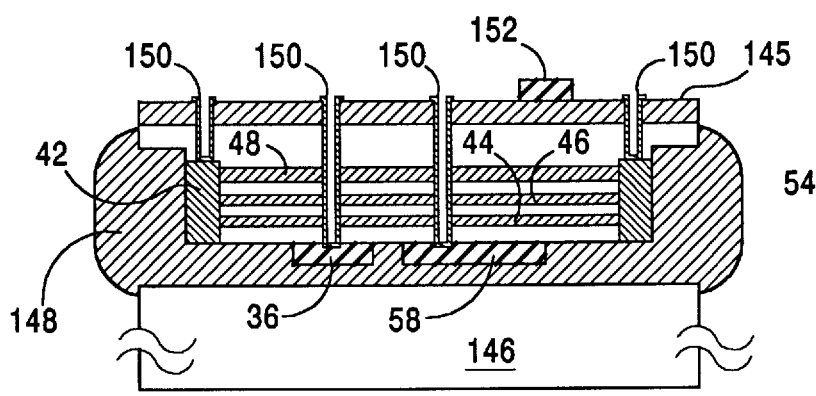

FIG. 8D shows the addition of vias 150 to emitter contact 42, collector contact 54, backgate 36, and control gate 58. It also shows the addition of depletion gate 152. The via holes are placed at locations sufficiently far away from the electrical conduction paths through the emitter layer 44 and collector layer 48 that they do not interfere with the operating of the device.

A similar method of fabricating a DELTT by the EBASE method would involve growing the epitaxial layers in reverse order and placing the control gate on the opposite side of the structure.

Figure 9:
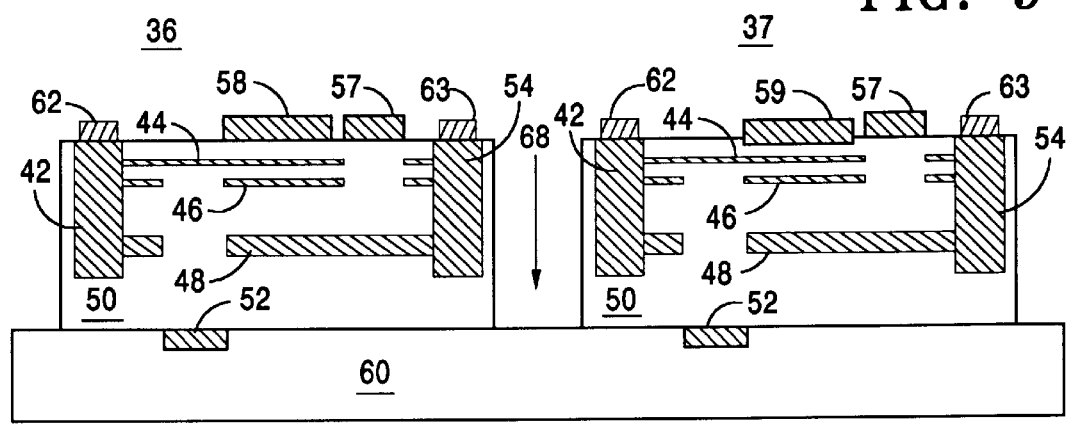
FIG. 9 shows two complementary integrated DELTTs according to the present invention.
Figure 10:
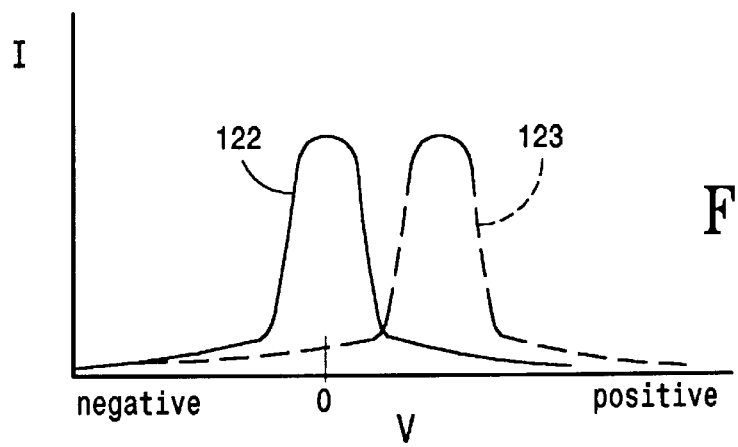
FIG. 10 shows the emitter-collector current of the DELTTs of FIG. 9, versus control gate voltage.

FIG. 9 shows two complementary integrated DELTTs, 36 and 37. DELTTs 36 and 37 are identical, except that control gate 59 of DELTT 37 has been recessed. The purpose of recessing control gate 59 is to bring it closer to emitter layer 44, causing the resonant control gate voltage to move to a more positive value. The resonant voltage of DELTT 37 is thus different from the resonant voltage of DELTT 36, for a given emitter-collector voltage. FIG. 10 shows the emitter-collector current versus control gate voltage for DELTTs 36, 37, both of which are at the same emitter-collector voltage, chosen so that the resonant control gate voltage of DELTT 36 is 0. Curve 122 is the current for DELTT 36, and curve 123 is the current for DELTT 37. DELTTs 36 and 37 are complementary, because one is on when the other is off. Unlike standard CMOS transistors, though, both DELTTs are n-type and have low electron masses, meaning that when integrated together they are faster than if one were a high electron mass p-type device as in standard CMOS technology. Note that an alternative method of creating two complementary DELTTs with different resonant control gate voltages would be to subject them to different emitter-collector voltages, instead of recessing one of the gates. This is accomplished by integration of a simple voltage divider circuit on the chip.

Figure 11:
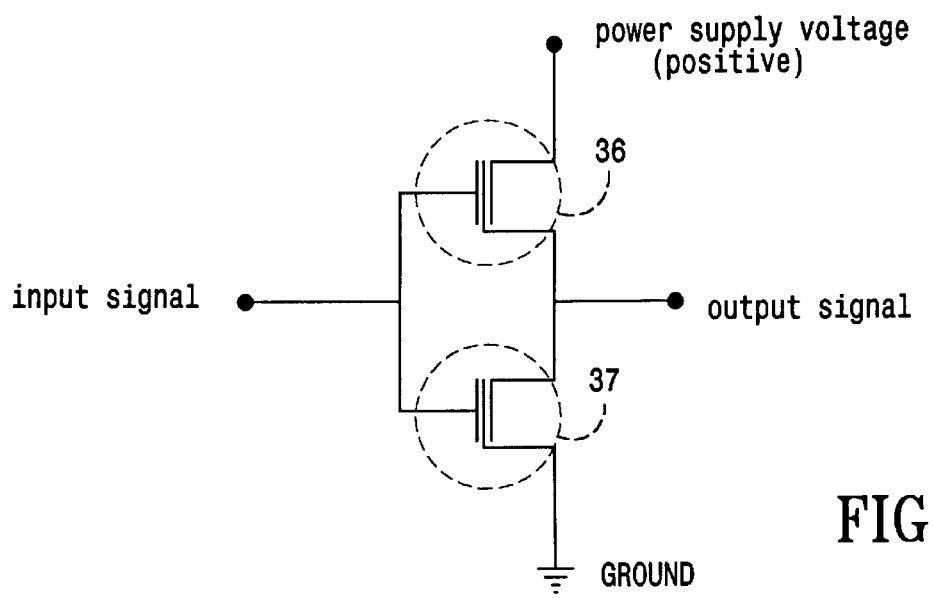
FIG. 11 shows a circuit in which the two complementary integrated DELTTs of FIG. 9 are configured to form a low-power unipolar complementary inverter.

FIG. 11 shows these two integrated DELTTs 36, 37 configured in a circuit to form a high speed, unipolar, complementary inverter for use in logic circuits. Because the circuit is complementary, significant current flows only during switching, meaning the power consumption is very low. Yet because the circuit is unipolar, it remains high speed. We note that because the emitter-collector voltages across DELTTs 36, 37 will vary as the circuit switches, the characteristics of DELTTs 36, 37 will need to be chosen so as to make the two states of the circuit in FIG. 11 stable. This may also require the addition of resistors and/or additional poles in the circuit.

Figure 12:
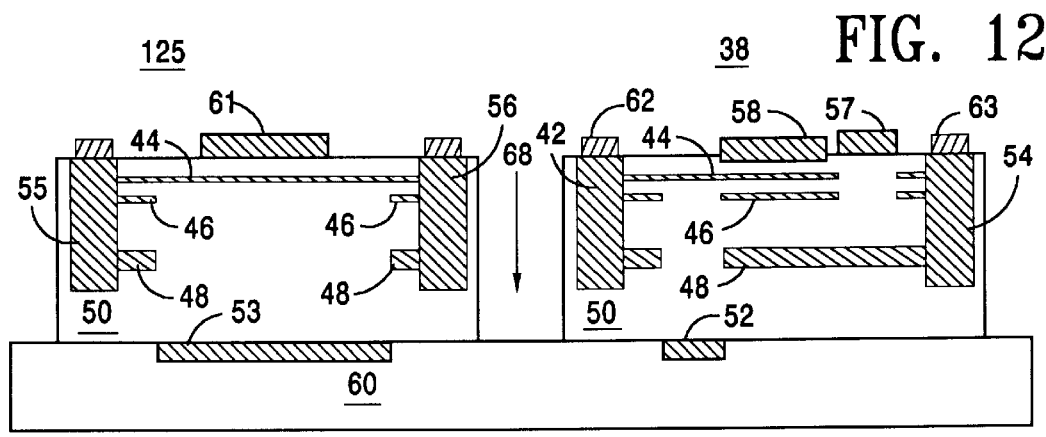
FIG. 12 shows a complementary integrated DELTT and enhancement mode FET (EFET).

FIG. 12 shows an integrated DELTT 38 and enhancement mode FET (EFET) 125. The EFET 125 is formed in the same epitaxial layer structure as DELTT 38. A large backgate 53 is used to deplete collector layer 48 (and optionally resonant tunneling layer 46 also) and so render it inactive. The remaining undepleted emitter layer 44 acts as the conducting channel of the EFET. The EFET gate 61 is recessed sufficiently that it acts in enhancement mode, requiring a positive voltage to induce electrons in emitter 44 and allow current flow between source 55 and drain 56.

Figure 13:
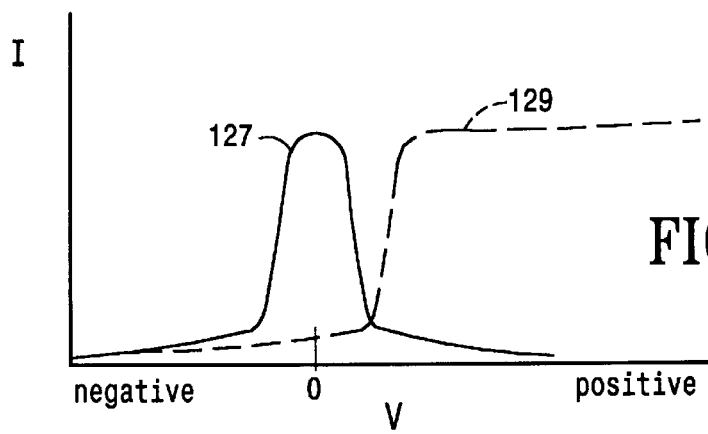
FIG. 13 shows the emitter-collector current versus control gate voltage of the DELTT of FIG. 12, and the source-drain current versus gate voltage of the EFET of FIG. 12.
Figure 14:
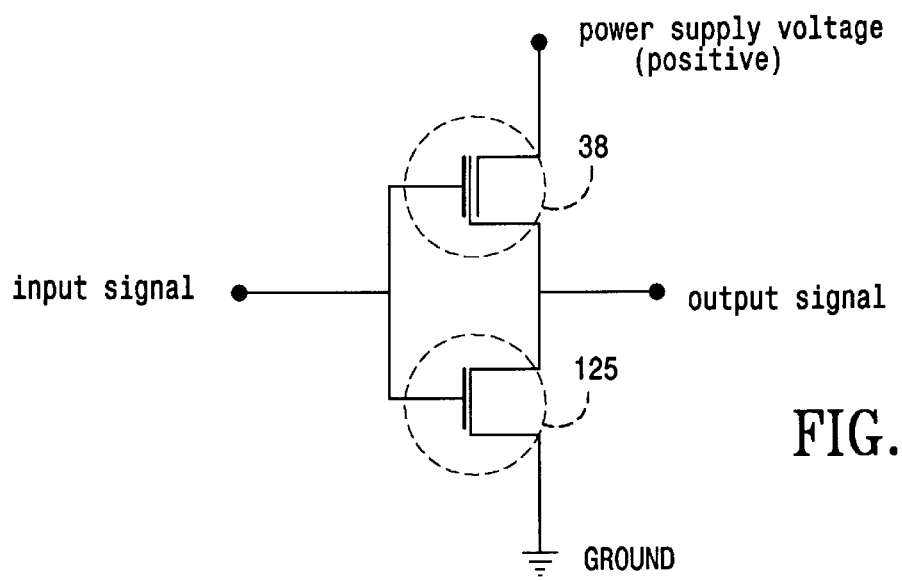
FIG. 14 shows a circuit in which the complementary integrated DELTT and enhancement mode FET of FIG. 12 are configured to form a unipolar complementary inverter.
Figure 15:
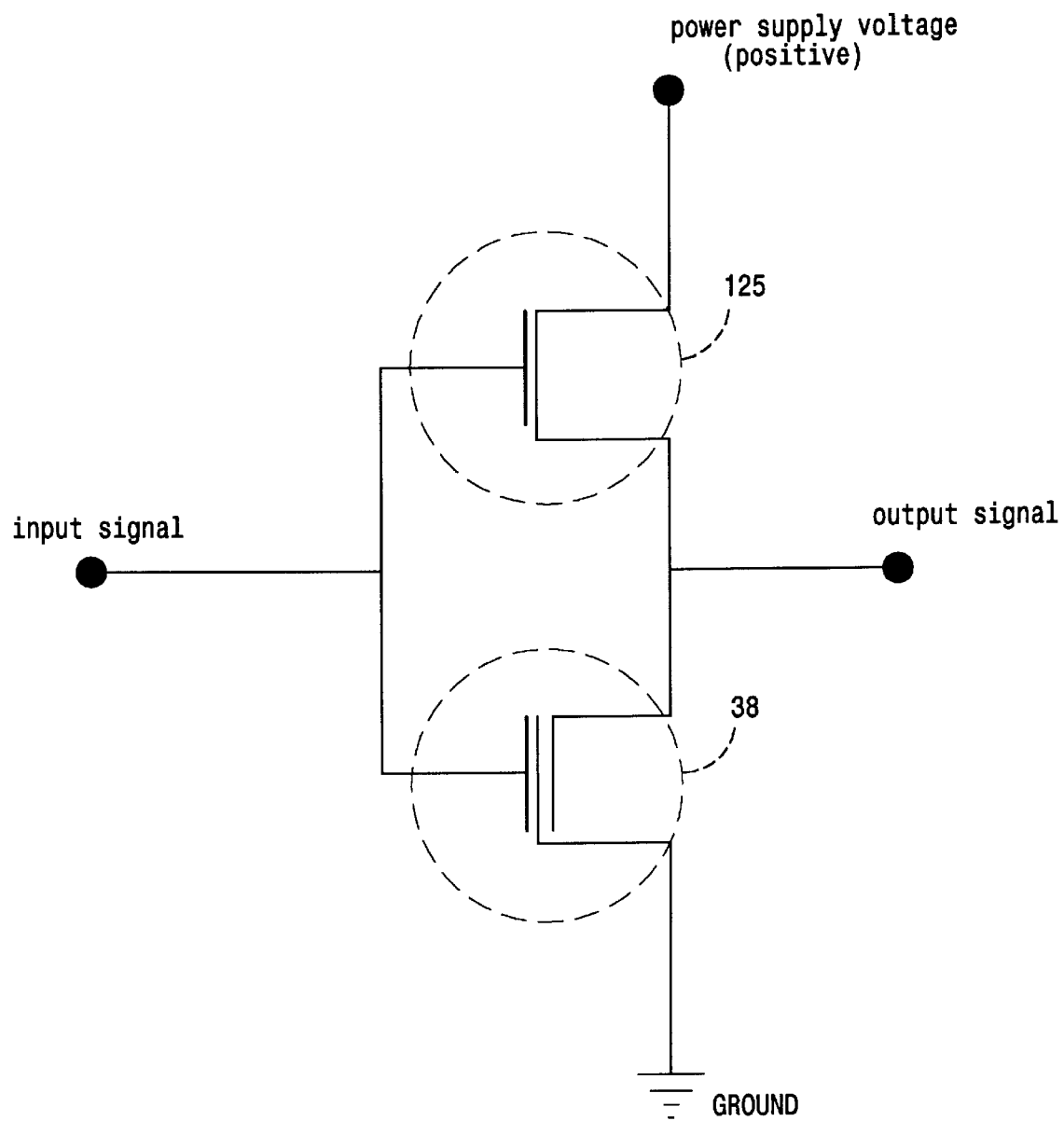

These two transistors can also operate as complementary devices, as shown in FIG. 13. FIG. 13 shows the emitter-collector current versus control gate voltage for DELTT 38 at a given emitter-collector voltage, and the source-drain current versus gate voltage for EFET 125. Curve 127 is the current for DELTT 38, and curve 129 is the current for EFET 125. Again, one device is on when the other is off. FIG. 14 shows DELTT 38 and EFET 125 configured in a circuit to form a high speed, low power, unipolar complementary inverter for use in logic circuits. Again, because the emitter-collector voltage across DELTT 38 will vary as the circuit switches, the characteristics of DELTT 38 will need to be chosen so as to make the two states of the circuit in FIG. 14 stable. This may also require the addition of resistors and/or additional poles in the circuit. Those skilled in the art will appreciate that DELTT 38 and EFET 125 can be exchanged, as shown in FIG. 15.

The particular values and configurations discussed herein can be varied and are cited merely to illustrate a few embodiments of the present invention. Other variations and modifications of the present invention will be apparent to those of ordinary skill in the art, and it is the intent of the appended claims that such variations and modifications be covered. It is contemplated that the use of the present invention can involve components having different characteristics as long as the principle, the presentation of a 2D-2D-3D tunneling electronic device, is followed.

The dimensions and materials of the preferred embodiment tunneling devices can be greatly varied while still preserving the mode of operation. For example, the aluminum gallium arsenide system could be replaced with other systems such as indium arsenide phosphide, mercury cadmium telluride, strained layers of lattice mis-matched systems, etc. and still maintain single crystal structures; and further, the devices could be fabricated from thin layers of glasses, insulators, metals, etc. and still provide the quantum well structure and operation as in the preferred embodiments. Also, strained layer superlattices, modulation doped superlattices, and tunable superlattices could be used and provide further controllable parameters in the operation.

Holes instead of electrons could be the carrier, or even both holes and electrons transported in opposite directions simultaneously. The energy levels could be changed by either dimensional changes or material changes or combinations. For example, the wells could have triangular composition profiles and more strained layers could be used. Indeed, any composition profile yielding electric subbands whose energies are oriented relative to one another in a manner comparable to the earlier preferred embodiments may be used.

We claim:

1. A double electron layer tunneling semiconductor device for two dimensional to two dimensional electron tunneling, said device comprising:

a) an emitter contact;
   b) a collector contact;
   c) a two dimensional quantum well emitter layer electrically contacting the emitter contact;
   d) a two dimensional quantum well resonant tunneling layer;
   e) a collector layer disposed opposite the resonant tunneling layer from the emitter layer, said collector layer electrically contacting the collector contact;
   f) a first tunneling barrier layer disposed between the emitter layer and the resonant tunneling layer;
   g) a second tunneling barrier layer disposed between the resonant tunneling layer and the collector layer;
   h) a voltage drop layer between the resonant tunneling layer and the collector;
   i) means for effectively preventing electrical contact between the emitter layer and the collector contact;
   j) means for effectively preventing electrical contact between the collector and the emitter contact;
       wherein the emitter layer, the resonant tunneling layer, the collector, the first and second barrier layers and the voltage drop layer permit resonant tunneling from the emitter to the resonant tunneling layer to the collector given a predetermined resonant voltage bias applied between the emitter contact and the collector contact.

2. The double electron layer tunneling semiconductor device of claim 1 wherein the means for effectively preventing electrical contact between the emitter layer and the collector contact comprises a depletion gate.

3. The double electron layer tunneling semiconductor device of claim 1 wherein the means for the effectively preventing electrical contact between the emitter layer and the collector contact comprises an isolation etch.

4. The double electron layer tunneling semiconductor device of claim 1 wherein the means for effectively preventing electrical contact between the emitter and the collector contact comprises an ion implant.

5. The double electron layer tunneling semiconductor device of claim 1 wherein the means for effectively preventing electrical contact between the collector and the emitter contact comprises a depletion gate.

6. The double electron layer tunneling semiconductor device of claim 1 wherein the means for effectively preventing electrical contact between the collector and the emitter contact comprises an isolation etch.

7. The double electron layer tunneling semiconductor device of claim 1 wherein the means for effectively preventing electrical contact between the collector and the emitter contact comprises an ion implant.

8. The double electron layer tunneling semiconductor device of claim 1 wherein the emitter layer, the resonant tunneling layer, the voltage drop layer and the collector comprise silicon germanium and the barrier layers comprise silicon.

9. The double electron layer tunneling semiconductor device of claim 1 wherein the emitter layer, the resonant tunneling layer, the voltage drop layer and the collector comprise silicon germanium and the first and second barrier layers comprise silicon.

10. The double electron layer tunneling semiconductor device of claim 1 wherein the emitter layer, the resonant tunneling layer, the voltage drop layer and the collector comprise gallium arsenide and the first and second barrier layers comprise aluminum gallium arsenide.

11. The double electron layer tunneling semiconductor device of claim 10 wherein the emitter layer is about 150 angstroms thick, the resonant tunneling layer is around 70 angstroms thick, and the first barrier layer is around 75 angstroms thick.

12. The double electron layer tunneling semiconductor device of claim 10 wherein the emitter layer is about 150 angstroms thick, the resonant tunneling layer is around 70 angstroms thick, and the first barrier layer is around 75 angstrom thick.

13. The double electron layer tunneling semiconductor device of claim 1, further comprising:
   a control gate for changing energies of occupied electron states in the emitter layer; and
   an insulating layer for electrically insulating the control gate from the emitter layer;
   thereby controlling the resonant voltage bias applied between the emitter contact and the collector contact.

14. The double electron layer tunneling semiconductor device of claim 13 wherein the means for effectively preventing electrical contact between the emitter layer and the collector contact comprises a depletion gate.

15. The double electron layer tunneling semiconductor device of claim 13 wherein the means for effectively preventing electrical contact between the emitter layer and the collector contact comprises an isolation etch.

16. The double electron layer tunneling semiconductor device of claim 13 wherein the means for effectively preventing electrical contact between the emitter and the collector contact comprises an ion implant.

17. The double electron layer tunneling semiconductor device of claim 13 wherein the means for effectively preventing electrical contact between the collector and the emitter contact comprises a depletion gate.

18. The double electron layer tunneling semiconductor device of claim 13 wherein the means for effectively preventing electrical contact between the collector and the emitter contact comprises an isolation etch.

19. The double electron layer tunneling semiconductor device of claim 13 wherein the means for effectively preventing electrical contact between the collector and the emitter contact comprises an ion implant.

20. The double electron layer tunneling semiconductor device of claim 13 wherein the emitter layer, the resonant tunneling layer, the voltage drop layer and the collector comprise gallium arsenide and the barrier layers and the insulating layer comprise aluminum gallium arsenide.

21. An integrated double electron layer tunneling semiconductor element comprising:
   a first double electron layer tunneling transistor (DELTT) and a second double electron layer tunneling transistor (DELTT), each DELTT including:
   a) an emitter contact;
   b) a collector contact;
   c) a two dimensional quantum well emitter layer electrically contacting the emitter contact;
   d) a two dimensional quantum well resonant tunneling layer;
   e) a collector layer disposed opposite the resonant tunneling layer from the emitter layer, said collector layer electrically contacting the collector contact;
   f) a first tunneling barrier layer disposed between the emitter layer and the resonant tunneling layer;
   g) second tunneling barrier layer disposed between the resonant tunneling layer and the collector layer;
   h) a voltage drop layer between the resonant tunneling layer and the collector;
   i) means for effectively preventing electrical contact between the emitter layer and the collector contact;
   j) means for effectively preventing electrical contact between the collector and the emitter contact;
   k) a control gate for changing energies of occupied electron states in the emitter layer; and
   l) an insulating layer for electrically insulating the control gate from the emitter layer; wherein the emitter layer, the resonant tunneling layer, the collector, the first and second barrier layers and the voltage drop layer of each DELTT permit resonant tunneling from the emitter to the resonant tunneling layer to the collector given predetermined resonant voltage biases applied between the emitter contact and the collector contact of each DELTT for given control gate voltages.

22. The integrated element of claim 21, wherein:
   the control gate of the second DELTT is positioned closer to the emitter layer of the second DELTT than the control gate of the first DELTT is to the emitter layer of the first DELTT, thereby moving the predetermined resonant voltage bias of the second DELTT to a different value than the predetermined resonant voltage bias of the first DELTT.

23. The integrated double electron layer tunneling semiconductor device of claim 22 configured as a unipolar complementary inverter which further comprises:
   means for connecting a first voltage to the emitter of the first DELTT;
   means for connecting the collector of the first DELTT to the emitter of the second DELTT;
   means for connecting the collector of the second DELTT to second voltage, said second voltage higher than the first voltage;
   means for connecting an input signal to the control gate of the first DELTT and the control gate of the second DELTT; and
   means for detecting an output signal at the connection between the collector of the first DELTT and the emitter of the second DELTT.

24. The integrated semiconductor clement comprising: a double electron layer tunneling transistor (DELTT) for two dimensional to two dimensional to three dimensional electron tunneling and an enhancement mode FET (EFET), the DELTT including:
   a) an emitter contact;
   b) a collector contact;
   c) a two dimensional quantum well emitter layer electrically contacting the emitter contact;
   d) a two dimensional quantum well resonant tunneling layer;
   e) a collector layer disposed opposite the resonant tunneling layer from the emitter layer, said collector layer electrically contacting the collector contact;
   f) a first tunneling barrier layer disposed between the emitter layer and the resonant tunneling layer;
   g) a second tunneling barrier layer disposed between the resonant tunneling layer and the collector layer;
   h) a voltage drop layer between the resonant tunneling layer and the collector;

i) means for effectively preventing electrical contact between the emitter layer and the collector contact;

j) means for effectively preventing electrical contact between the collector and the emitter contact;

k) a control for changing energies of occupied electrons states in the emitter layer; and l) an insulating layer for electrically insulating the control gate from the emitter layer;

wherein the emitter layer, the resonant tunneling layer, the collector, the first and second barrier layers and the voltage drop layer permit resonant tunneling from the emitter to the resonant tunneling layer to the collector given a predetermined resonant voltage bias applied between the emitter contact and the collector contact for a given control gate voltage.

25. The integrated element of claim 24 configured as a unipolar complementary inverter which further comprises:

means for connecting a first voltage to the collector of the DELTT;

means for connecting the emitter of the DELTT to the source of the EFET;

means for connecting the drain of the EFET to a second voltage, the second voltage lower than the first voltage;

means for connecting an input signal to the control gate of the DELTT and the gate of the EFET; and means for detecting an output signal at the connection between the emitter of the DELTT and the source of the EFET.

26. The integrated element of claim 24 configured as a unipolar complementary inverter which further comprises:

means for connecting a first voltage to the source of the EFET;

means for connecting the drain of the EFET to the collector of the DELTT;

means for connecting the emitter of the DELTT to a second voltage, the second voltage lower than the first voltage;

means for connecting an input signal to the control gate of the DELTT and the gate of the EFET; and means for detecting an output signal at the connection between the collector of the DELTT and the drain of the EFET.

* * * * *